United States Patent
Caravella et al.

[11] Patent Number: 6,041,221
[45] Date of Patent: Mar. 21, 2000

[54] CIRCUIT AND METHOD FOR VERIFYING DATA OF A WIRELESS COMMUNICATIONS DEVICE

[75] Inventors: James S. Caravella, Chandler; David F. Mietus, Phoenix; Jeremy W. Moore, Chandler, all of Ariz.

[73] Assignee: Motorola, Inc., Schaumburg, Ill.

[21] Appl. No.: 08/859,898

[22] Filed: May 21, 1997

[51] Int. Cl.[7] .................................................. H04Q 7/20
[52] U.S. Cl. ................................. 455/186.1; 455/185.1; 365/189.05
[58] Field of Search .......................... 455/186.1, 185.1, 455/183.1, 575, 550; 365/189.05, 189.09, 185.2, 185.22, 185.18

[56] References Cited

U.S. PATENT DOCUMENTS

| | | | |
|---|---|---|---|
| 4,686,706 | 8/1987 | Sakai | 455/340 |
| 5,557,568 | 9/1996 | Miyamoto et al. | 365/185.22 |
| 5,726,936 | 3/1998 | Whitfield | 365/185.23 |
| 5,748,538 | 5/1998 | Lee et al. | 365/185.06 |
| 5,754,469 | 5/1998 | Hung et al. | 365/185.12 |
| 5,819,305 | 10/1998 | Nixon | 365/185.21 |

Primary Examiner—Edward F. Urban
Assistant Examiner—Tilahun Gesesse
Attorney, Agent, or Firm—Lanny L. Parker

[57] ABSTRACT

A memory circuit (24) limits the threshold voltage distribution for either programming or erasing a memory cell (40A) in a non-volatile memory array (34). A data latch (90) provides a current ($I_{REF}$) to the memory cell (40A) that increases in current as the operating temperature of the memory cells (40A, 40B) increases. Current generated by the data latch (90) increases when the processing parameters cause a greater conductivity of the transistors in the memory cell (40A) and the current decreases when the processing parameters cause a lesser conductivity of the transistors in the memory cell (40A), thus allowing narrower limits on the distribution of the program and erase threshold voltages.

19 Claims, 2 Drawing Sheets

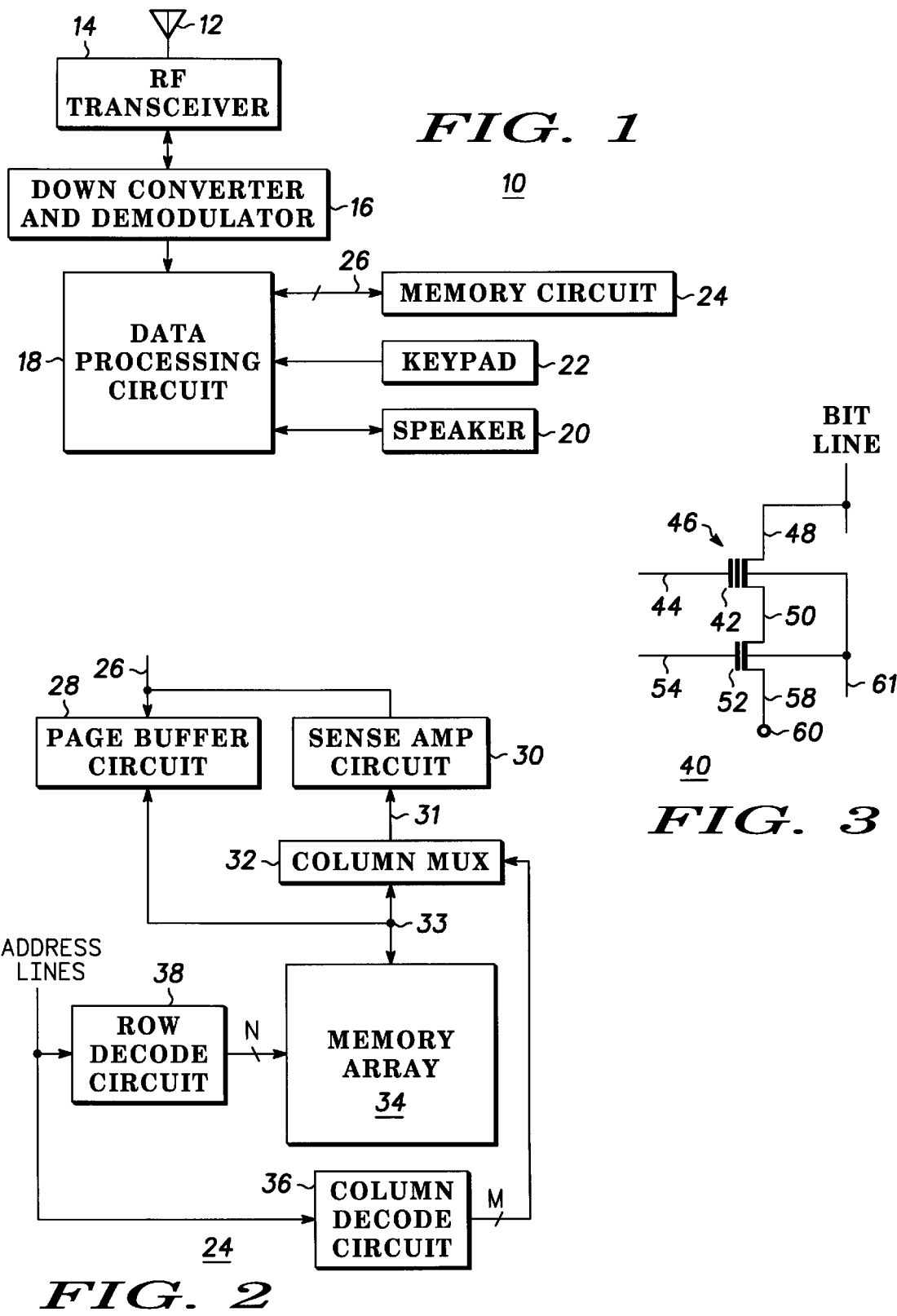

6,041,221

CIRCUIT AND METHOD FOR VERIFYING DATA OF A WIRELESS COMMUNICATIONS DEVICE

BACKGROUND OF THE INVENTION

The present invention relates, in general, to integrated circuits and, more particularly, to memory circuits.

A portable wireless system such as a cellular phone or a pager uses analog and active circuitry to convert signals between frequencies ranging from radio frequency (RF) to voice band. Received RF signals are converted to base-band signals through circuits such as an RF transceiver, a down converter, and a demodulator. For a cellular phone the converted base-band signals are processed into recognizable speech in the voice band frequencies. A digital signal processor (DSP) uses data stored in a static random access memory (SRAM) and a FLASH memory to process the base-band signals.

The FLASH memory, such as an array of floating gate non-volatile memory cells, is used to store software program instructions used by the digital signal processor. The high density FLASH memory needs to be easily programmed or "written" and, as the occasion arises, to reprogram ("erase" and "rewrite") the device in the field. Associated with the memory array are page buffer latches that store data for programming multiple memory cells in a page programming mode. The page buffer latches allow an entire row of data for a FLASH memory to be simultaneously read.

The page buffer latch supplies a current to the memory cell in accordance with data that is stored in the latch. The smallest area for an integrated page buffer latch includes two inverters for latching the data. The output inverter is used to source the current onto a bit line that connects to the memory cell. The current can vary both with the processing parameters used in the fabrication of the memory circuit and with the operating supply voltage that powers the page buffer latch. Thus, a wide distribution in the value of the current is generated by the page buffer latch. The wide distribution can cause difficulties in the verification of the data programmed into the memory cells.

Accordingly, it would be advantageous to have a page buffer latch circuit that controls the distribution of the values for the current that is used in verification of the data that is programmed in the memory cells.

BRIEF DESCRIPTION OF THE DRAWINGS

FIG. 1 is a block diagram of a wireless communications device;

FIG. 2 is a block diagram of a non-volatile memory in the wireless communications device;

FIG. 3 is a schematic diagram of a memory cell in the memory circuit;

DETAILED DESCRIPTION OF THE PREFERRED EMBODIMENT

Figure 4:
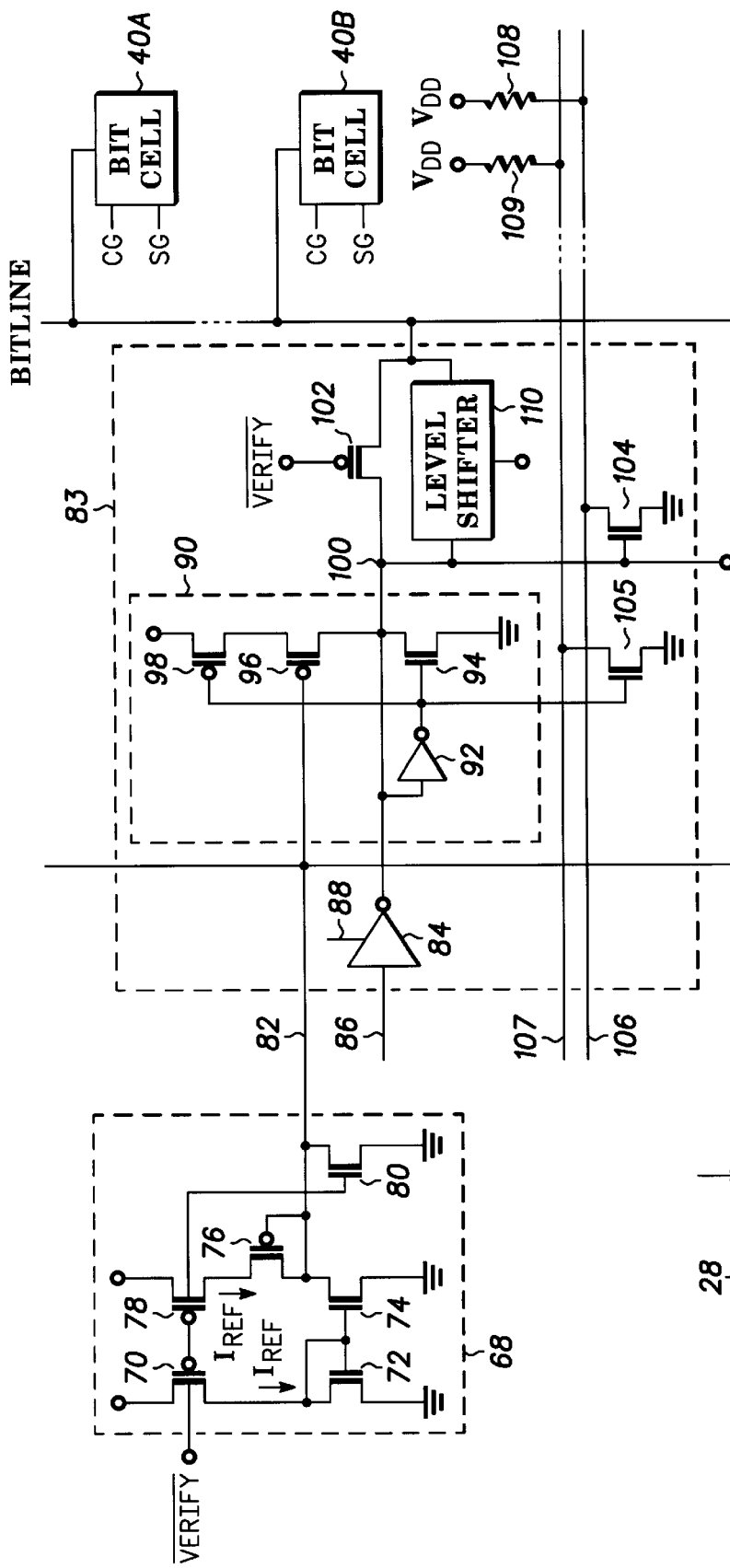
FIG. 4 is a schematic diagram of a reference current generator and data latch found in the page buffer circuit of the memory circuit.

Generally, the present invention provides a memory circuit that limits the threshold voltage distribution for either programming or erasing a memory bit cell in a non-volatile memory array. A data latch circuit provides a current to the memory bit cell that decreases in current as the operating temperature of the memory bit cells increases. Additionally, current generated by the data latch increases when the processing parameters cause a greater conductivity of the transistors in the memory bit cell and the current decreases when the processing parameters cause a lesser conductivity of the transistors in the memory bit cell, thus allowing narrower limits on the distribution of the program and erase threshold voltages.

FIG. 1 is a block diagram of a wireless communication device 10 such as a cellular telephone or a two-way radio. Wireless communication device 10 includes an antenna 12, an RF transceiver 14 (transmitter circuit and a receiver circuit), a down converter and demodulator circuit 16, a data processing circuit 18, a speaker 20, a keypad 22, and a memory circuit 24. Antenna 12 receives a transmitted radio frequency carrier signal modulated with digital information. RF transceiver 14 amplifies the RF carrier signal and converts the frequency down to an intermediate frequency (IF) signal which is coupled to an input of a down converter and demodulator circuit 16. It should be noted that RF transceiver 14 is also referred to as a translator that is coupled for receiving a transmitted signal. Down converter and demodulator circuit 16 extracts the digital information from the IF signal to produce baseband digital data which is coupled to an input of a data processing circuit 18. Data processing circuit 18 operates under the control of software program instructions that are stored in a nonvolatile FLASH memory in memory circuit 24. Data processing circuit 18 has an input that receives data from keypad 22 and an output that produces audio signals for driving speaker 20.

FIG. 2 is a block diagram of memory circuit 24. FLASH memory circuit 24 is initially erased and memory cells that are to be programmed with a logic one data value are written. Page buffer circuit 28 is coupled for receiving input signals via bi-directional bus 26. Page buffer circuit 28 is connected to sense amp circuit 30 via a bus 26. Sense amp circuit 30 has a data bus 31 that connects to a column mux 32. Column mux 32 has control inputs that are coupled for receiving address signals and allows data to be read from selected bit lines in memory array 34. Column decode circuit 36 receives address lines from the address bus and decodes the address lines for selecting a column of memory cells in column mux 32. Row decode circuit 38 receives address lines from the address bus and decodes the address lines for selecting a row of memory cells within memory array 34. It should be noted that the number of lines for bi-directional buses 26, 31, and 33 is not a limitation of the present invention.

FIG. 3 is a block diagram of a memory cell 40. Briefly referring to FIG. 2, multiple instances of memory cell 40 are configured into an array and arranged in rows and columns of memory array 34 (array not shown). Memory cell 40 is a two-transistor memory cell that includes a control transistor 42 and a select transistor 52. Control transistor 42 has a gate terminal 44, a gate structure 46, a drain region 48, and a source region 50. Select transistor 52 has a gate terminal 54, a drain region 50, and a source region 58. In particular, drain region 48 of control transistor 42 serves as an output of memory cell 40 that either receives or generates a signal, BIT LINE. The source region of control transistor 42 is commonly connected to the drain region of select transistor 52 and is referred to by the reference number 50. Source region 58 of select transistor 52 is connected to a power supply conductor 60. Both drain region 48 and source region 50 of control transistor 42 and both drain region 50 and source region 58 of select transistor 52 are disposed in a well region that is contracted by well terminal 61. Select transistor 52 is shown connected to the source of control transistor 42 and is referred to as a source selected memory architecture. However, the type of memory architecture is not a limitation of the present invention. In other words, the erase memory cell could be a one-transistor memory cell architecture.

It should be noted that control transistor 42 is shown as a floating gate transistor. In other words, control transistor 42 is a non-volatile memory storage transistor that traps charge on a floating gate, i.e., a gate material that is separate and isolated from the gate terminal. It should be further noted that control transistor 42 and select transistor 52 are shown as N-channel metal oxide semiconductor field effect transistors (MOSFETs). However, the type of transistor is not a limitation of the present invention.

In operation, memory cell 40 stores digital data in a PROGRAM mode, reads stored digital data in a READ mode, and erases stored digital data in an ERASE mode. Gate terminals 44 and 54 of memory cell 40 are referred to as a control terminal and a select gate, respectively. Power supply conductor 60 is referred to as a SOURCE TERMINAL.

The TABLE below lists the voltage values that are applied to the control terminal, the select gate, the SOURCE TERMINAL, and the WELL TERMINAL of memory cell 40 when operating in the READ mode, the PROGRAM mode, and the ERASE mode. In addition, a voltage value is also supplied as the BIT LINE signal in the PROGRAM mode. By way of example, the value stored in memory cell 40 is output as the BIT LINE signal in the READ mode when the select gate voltage transitions from about 0 volts to about $V_{DD}$, and the control terminal and SOURCE TERMINAL have voltage values of about +1.2 volts and about 0 volts, respectively.

Alternatively, a value is stored in memory cell 40 in the PROGRAM mode when the respective voltage values of about −9 volts and about 0 volts are supplied to the control terminal and to the SOURCE TERMINAL. The voltage value on the gate terminal of select transistor 52 is any voltage within the range of $V_{DD}$ to ground. Memory cell 40 is programmed when the BIT LINE signal has a value of about +5.5 volts and remains unchanged when the BIT LINE signal has a value of about 0 volts. The letter X in the table represents a don't care voltage value.

| MODE | BIT LINE SIGNAL | CONTROL TERMINAL VOLTAGE | SELECT GATE VOLTAGE | SOURCE TERMINAL VOLTAGE | WELL TERMINAL VOLTAGE |
| --- | --- | --- | --- | --- | --- |
| READ | output | +1.2V | 0V/VDD | 0V | 0V |
| PROGRAM | +5.5V | −9V | X | 0V | 0V |
| ERASE | floats | +13V | 0V | −5V | −5V |

The logic value stored in memory cell 40 is cleared in the ERASE mode when the select gate voltage is about zero volts, and the respective voltage values of about +13 volts and about −5 volts are supplied to the control terminal and to the SOURCE TERMINAL.

FIG. 4 is a schematic diagram of a page buffer circuit 28 as shown in memory circuit 24. Page buffer circuit 28 includes a reference current generator 68, a data latch 90, and a MOSFET 104. Reference current generator 68 generates a voltage $V_{GS}$, i.e., a compensation signal, at output terminal 82 during a verify mode. The verify mode includes both a program verify and an erase verify. The program verify involves validating the data that has previously been programmed into memory cells such as, for example, memory cells 40A and 40B in memory array 34. The erase verify involves validating that the data previously programmed into the memory cells has been cleared. In the verify mode an input signal $\overline{\text{VERIFY}}$ having a logic zero value allows P-channel MOSFET 70 to be conductive. The gate of MOSFET 70 is sized to have a width $W_{70}$ and a length $L_{70}$ and conduct a current $I_{REF}$ that is proportional to the ratio of ($W_{70}/L_{70}$). The source terminal of MOSFET 70 is connected to a power supply conductor that is coupled for receiving the voltage $V_{REF}$, where $V_{REF}$ is a bandgap voltage reference having a value of about 1.2 volts. The current $I_{REF}$ is a reference current that is compensated for supply voltage variation and generated by MOSFET 70 that also flows through MOSFET 72. N-channel MOSFETs 72 and 74 are configured to operate as a current mirror such that both MOSFETs 72 and 74 conduct similar currents of $I_{REF}$. Thus, the current $I_{REF}$ in MOSFET 74 is also conducted through P-channel MOSFETs 76 and 78.

When the input signal $\overline{\text{VERIFY}}$ has a logic zero value, MOSFET 78 is conductive and an output voltage $V_{GS}$ is generated at terminal 82 of reference current generator 68. By way of example, $V_{GS}$ has a voltage value of about 600 milivolts. It should be noted that the drain-to-source voltage of MOSFET 78 is substantially zero volts when the input signal $\overline{\text{VERIFY}}$ has a logic zero value. Output voltage $V_{GS}$ represents the voltage across the gate and source terminals of MOSFET 76 when the transistor is conducting the current $I_{REF}$. It should be further noted that the current $I_{REF}$ that is generated by MOSFET 70 is substantially supply voltage independent. In other words, the current $I_{REF}$ is not dependent on the supply voltage $V_{DD}$, but rather on the stable bandgap voltage reference $V_{REF}$. Fluctuations or changes in the supply voltage $V_{DD}$ have no substantially effect on the value for the current $I_{REF}$, but changes in the supply voltage $V_{DD}$ do change the voltage $V_{GS}$ that is generated at output terminal 82.

Input signal $\overline{\text{VERIFY}}$ has a logic zero value in the verify mode and causes N-channel MOSFET 80 to be nonconducting. The voltage at output terminal 82 has the value of $V_{GS}$. On the other hand, when the input signal $\overline{\text{VERIFY}}$ has a logic one value during a other than the verify mode, MOSFETs 70 and 78 are nonconducting and MOSFET 80 is conducting. The output voltage at output terminal 82 has the voltage value of about ground when MOSFET 80 is conducting.

In the verify mode the voltage $V_{GS}$ from reference current generator 68 is supplied to data latch 90 and generates a current $I_{REF}$ in P-channel MOSFET 96. The similarities in the connections of P-channel MOSFETs 76 with 78 and P-channel MOSFETs 96 with 98 should be noted. For instance, the source terminals of MOSFETs 76 and 96 are coupled to $V_{DD}$ through respective MOSFETs 78 and 98. The drain-source voltage of MOSFET 78 is substantially zero in the verify mode and the drain-source voltage of MOSFET 98 is substantially zero when the latched data at output terminal 100 has a logic one value. MOSFET 76 in reference current generator 68 and MOSFET 96 in data latch 90 are configured to form a current mirror.

Data is loaded into data latch 90 through a tri-state buffer 84. Input terminal 86 of tri-state buffer 84 is coupled for receiving data. By way of example, when input terminal 86 receives a logic zero value, the logic zero value is complemented and transferred to the output of tri-state buffer 84 when a tri-state control terminal 88 receives a logic one signal. Inverter 92 complements the logic one value and supplies a logic zero value to the gate terminal of MOSFETs 94 and 98. The logic zero value causes N-channel MOSFET 94 to be nonconductive and P-channel MOSFET 98 to be conductive. In the verify mode the voltage $V_{GS}$ received at the gate terminal of P-channel MOSFET 96 generates a current $I_{REF}$ in the transistor. The current $I_{REF}$ flowing through MOSFETs 96 and 98 charges the capacitive load on output terminal 100 and generates the logic one value that is the feedback to the input of data latch 90.

The gate terminal of P-channel MOSFET 102 is coupled for receiving the signal $\overline{VERIFY}$ and the transistor is conductive in the verify mode. It should be noted that MOSFET 102 is a high voltage P-channel transistor to standoff program events. The current $I_{REF}$ generated by MOSFET 96 is available to memory cells 40A and 40B through the electrical connection path BIT LINE. A level shifter 110 is not active during the verify mode.

Briefly referring to FIGS. 3 and 4, control gate (CG) 44 is biased to a voltage of about zero volts and select gate (SG) 54 has a voltage of about $V_{DD}$ in the program verify mode. Thus, select gate 54 having the voltage $V_{DD}$ selects the memory cells in a particular row and the BIT LINE providing the current $I_{REF}$ selects memory cells in a particular column of memory array 34. By way of example, memory cell 40A is selected as the cell in memory array 34 having both a voltage $V_{DD}$ on the select gate and the current $I_{REF}$ on the BIT LINE. In accordance with the trapped charge on the floating gates of memory cell 40A, a portion of the current $I_{REF}$ available on the BIT LINE flows to power supply conductor 60. In the verify mode a voltage of about zero volts is supplied to power supply conductor 60. When only a small portion of the current $I_{REF}$ flows in control transistor 42 and select transistor 52, memory cell 40A has not been sufficiently programmed, i.e., the threshold voltages of transistor 42 is high. When substantially all of the current $I_{REF}$ flows in control transistor 42 and select transistor 52, memory cell 40A has been sufficiently programmed, i.e., the threshold voltage of transistor 42 is low. It should be noted that a small portion of the current $I_{REF}$ as generated by MOSFET 96 in data latch 90 supplies leakage currents to the PN-junction diodes and unselected bit cells that are connected to the BIT LINE.

The source current $I_{REF}$ generated by MOSFET 96 in data latch 90 is the sink current in control transistor 42 and select transistor 52 of memory cell 40A for a properly programmed memory cell. In other words, memory cell 40A is properly programmed when low threshold voltage values, i.e., below zero volts, for control transistor 42 and select transistor 52 cause the transistors to sink the current $I_{REF}$. Data latch 90 flips state when memory cell 40A sinks the current $I_{REF}$ and latches a logic zero value at output terminal 100. The logic zero value causes N-channel MOSFET 104 to be nonconductive. A resistor 108 pulls line 106 to a logic one value when all transistors such as, for example, MOSFET 104, are nonconductive. Thus, a properly programmed memory cell 40A is verified when memory cell 40A is selected by row and column in memory array 34 and line 106 has a logic one value. It should be noted that memory cell 40A is in the program verify mode for a time $t_{verify}$ of about one microsecond.

Again referring to FIGS. 3 and 4, control gate (CG) 44 is biased to a voltage $V_{TE}$ of about three volts and select gate (SG) 54 has a voltage of about $V_{DD}$ in the erase verify mode. Data latch 90 is loaded with a data value that latches a logic one at output terminal 100. MOSFET 96 generates a current $I_{REF}$ that flows through MOSFET 102 to a selected memory cell such as, for example, memory cell 40A. When the memory cell is not capable of sinking the current $I_{REF}$, data latch 90 maintains a logic one value at output terminal 100. The logic one value causes an N-channel MOSFET 105 to be nonconductive. A resistor 109 pulls a line 107 to a logic one value when all transistors such as, for example, MOSFET 105, are nonconductive. Thus, a properly erased memory cell 40A is verified when memory cell 40A is selected by row and column in memory array 34 and line 107 has a logic one value. It should be noted that memory cell 40A is in the erase verify mode for a time $t_{verify}$ of about one microsecond.

When not in the verify mode, data latch 90 latches a complemented value of the data received at the input of tri-state buffer 84 at output terminal 100. The latched data is transferred through level shifter 110 to the BIT LINE.

Each column of arrayed cells in memory array 34 (FIG. 2) is connected by a BIT LINE to a page driver circuit 83 (FIG. 4). Reference current generator 68 provides an output voltage $V_{GS}$ that supplies multiple page driver circuits 83. Each BIT LINE is precharged for about one microsecond to ensure that the BIT LINE has a logic one value, i.e., a voltage value of about $(V_{DD}-V_{TH})$, where $V_{TH}$ is a threshold voltage of the precharge transistor. With a page driver circuit 83 connected to each BIT LINE, the data in a selected row of memory array 34 can be read. In other words, a burst read or page read operation for the FLASH memory of memory circuit 24 can be achieved by the present invention.

In the page read, the control gate has a voltage value of about 1.2 volts. Data latch 90 is loaded with a data value that latches a logic one at output terminal 100. MOSFET 96 generates a current $I_{REF}$ that flows through MOSFET 102 to a selected memory cell such as, for example, memory cell 40A. When memory cell 40A is programmed to have a low threshold voltage, the current $I_{REF}$ flows to a ground potential in memory cell 40A. Memory cell 40A providing a current sink for the current $I_{REF}$ causes data latch 90 to flip state and latch a logic zero value at output terminal 100. When memory cell 40A is programmed to have a high threshold voltage, the current $I_{REF}$ does not flow to a ground potential in memory cell 40A. The data latch 90 maintains a logic one value at output terminal 100. Data is output from terminal 100 of multiple data latches 90 for a parallel read operation. Thus, by providing a page driver circuit 83 to each BIT LINE and selecting an entire row of memory cells in memory array 34 for the read mode, the present invention performs a page read operation. By way of example, the page read operation takes one microsecond in addition to the one microsecond precharge time.

Figure 5:
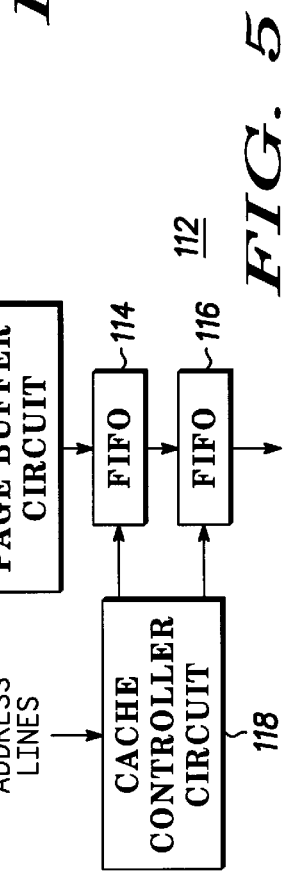
FIG. 5 is a block diagram of a high speed memory cache using a FLASH memory.

FIG. 5 is a block diagram of a high speed memory cache 112 using a FLASH memory. The page read mode allows FLASH memory circuit 24 (FIG. 1) to be utilized as a high speed memory cache 112. It should be noted that the page read mode that supplies parallel data from memory array 34 is also referred to as a burst read mode. When page buffer circuit 28 receives simultaneous data from a row of bit cells located in memory array 34, the parallel data is stored by latches such as, for example, latch 90 in page buffer circuit 28. The multiple bits of stored data are transferred to temporary storage locations such as first-in-first-out (FIFOs) 114 and 116.

Memory cache 112 reads data corresponding to a memory address supplied to a cache controller circuit 118. An output of cache controller circuit 118 is supplied to FIFO 114 and FIFO 116 for controlling the storage of the data that is received from page buffer circuit 28. Cache controller circuit 118 controls memory cache 112 to store data from a temporal locality.

By now it should be appreciated that a reference current generator has been provided that generates a stable current from a bandgap voltage reference that is relatively insensitive to both process parameter changes and to operating supply changes for the memory circuit. The stable current is used in the data latch to reliably verify the data either programmed into or erased from the nonvolatile memory cells in a memory array. In addition, the present invention provides a burst read or page read operation.

We claim:

1. A memory circuit for storing data, comprising:

a first plurality of bit cells having a first common bit line; and a first latch having an output for providing a reference current which is compensated for supply voltage variation to the first common bit line when the first latch is set to a first state to verify a programming state of one of the first plurality of bit cells, wherein the first latch switches to a second state and discontinues providing the reference current when the one of the first plurality of bit cells sinks the reference current.

2. The memory circuit of claim 1, wherein the first latch includes:

a first transistor having a first current carrying terminal coupled to a first power supply conductor, a control terminal coupled for receiving a complemented first state; and a second transistor having a first current carrying terminal coupled to a second current carrying terminal of the first transistor, a control terminal coupled for receiving a compensation signal, and a second current carrying terminal coupled to the output of the first latch.

3. The memory circuit of claim 2, wherein the first latch further includes:

an inverter having an input coupled to an input of the first latch and an output providing the complemented first state; and a third transistor having a control terminal coupled to the output of the inverter, a first current carrying terminal coupled to a second power supply conductor, and a second current carrying terminal that serves as the output of the first latch and is coupled to the input of the inverter.

4. The memory circuit of claim 3, further including a tri-state buffer having an input for receiving a data signal, a control terminal for receiving a control signal, and an output coupled to the input of the first latch.

5. The memory circuit of claim 2, further including a reference current circuit, wherein the reference current circuit comprises:

a first transistor having a first current carrying terminal coupled to a bandgap power supply conductor;

a second transistor having a first current carrying terminal coupled to a second power supply conductor, and a second current carrying terminal and a control terminal commonly coupled to a second current carrying terminal of the first transistor;

a third transistor having a first current carrying terminal coupled to the second power supply conductor, a control terminal coupled to the control terminal of the second transistor, and a second current carrying terminal that serves as an output and provides the compensation signal;

a fourth transistor having a control terminal and a second current carrying terminal coupled to the second current carrying terminal of the third transistor; and a fifth transistor having a control terminal coupled to the control terminal of the first transistor, a first current carrying terminal coupled to the first power supply conductor, and a second current carrying terminal coupled to a first current carrying terminal of the fourth transistor.

6. The memory circuit of claim 5, wherein the reference current circuit further includes a sixth transistor having a control terminal coupled to the control terminal of the fifth transistor, a first current carrying terminal coupled to the second power supply conductor, and a second current carrying terminal coupled to the second current carrying terminal of the third transistor.

7. The memory circuit of claim 1, further including a transistor having a first current carrying terminal coupled to the output of the first latch, a second current carrying terminal coupled to the first common bit line, and a control terminal coupled for receiving a control signal.

8. The memory circuit of claim 1, further comprising a state detection transistor having a gate terminal coupled to the output of the first latch, a first current carrying terminal coupled to a second power supply conductor, and a second current carrying terminal coupled to a node that provides a first logic value as verification of the data programmed in the one of the first plurality of bit cells.

9. The memory circuit of claim 1, further including:

a second plurality of bit cells having a second common bit line; and a second latch coupled to the second common bit line where the data stored in the memory circuit is simultaneously provided at the outputs of the first and second latches in page read mode.

10. A wireless communication device, comprising:

a receiver circuit having an input coupled for receiving a radio frequency carrier signal and an output for producing digital data;

a digital processing circuit for processing the digital data and producing an output signal; and a memory circuit for storing and transferring data to the digital processing circuit, where the memory circuit includes, (a) a bit cell having an input connected to a bit line for receiving a reference current, and (b) a latch having an output connected to the bit line, the latch set to a first state to provide the reference current which is compensated for supply voltage variations, wherein the latch switches to a second state and discontinues providing the reference current when the bit cell sinks the reference current.

11. The wireless communication device of claim 10, wherein the latch includes:

a first transistor having a first current carrying terminal coupled to a first power supply conductor, a control terminal coupled for receiving a complemented first state; and a second transistor having a first current carrying terminal coupled to a second current carrying terminal of the first transistor, a control terminal coupled for receiving a compensation signal, and a second current carrying terminal coupled to the output of the latch.

12. The wireless communication device of claim 11, wherein the latch further includes:

an inverter having an input coupled to an input of the latch and an output having a complemented first state; and a third transistor having a control terminal coupled to the output of the inverter, a first current carrying terminal coupled to a second power supply conductor, and a second current carrying terminal that serves as the output of the latch and is coupled to the input of the inverter.

13. The wireless communication device of claim 12, further including a tri-state buffer having an input for receiving a data signal, a control terminal for receiving a control signal, and an output coupled to the input of the latch.

14. The wireless communication device of claim 10, further including a transistor having a first current carrying terminal coupled to the output of the latch, a second current carrying terminal coupled to the common bit line, and a control terminal coupled for receiving a signal.

15. The wireless communication device of claim 10, the memory circuit further comprising a reference current circuit, wherein the reference current circuit includes:

a first transistor having a first current carrying terminal coupled to a bandgap power supply conductor;

a second transistor having a first current carrying terminal coupled to a second power supply conductor, and a second current carrying terminal and a control terminal commonly coupled to a second current carrying terminal of the first transistor;

a third transistor having a first current carrying terminal coupled to the second power supply conductor, a control terminal coupled to the control terminal of the second transistor, and a second current carrying terminal that serves as an output and provides the compensation signal;

a fourth transistor having a control terminal and a second current carrying terminal coupled to the second current carrying terminal of the third transistor; and a fifth transistor having a control terminal coupled to the control terminal of the first transistor, a first current carrying terminal coupled to the first power supply conductor, and a second current carrying terminal coupled to a first current carrying terminal of the fourth transistor.

16. The wireless communication device of claim 15, wherein the reference current circuit further includes a sixth transistor having a control terminal coupled to the control terminal of the fifth transistor, a first current carrying terminal coupled to the second power supply conductor, and a second current carrying terminal coupled to the second current carrying terminal of the third transistor.

17. A method for verifying a programming state of a bit cell in a memory circuit, comprising:

setting a latch to a latch state;

providing a reference current from the latch to a bit line of the bit cell when the latch is set to the latch state; and switching the latch to a second latch state to discontinue the reference current when the bit cell sinks the reference current.

18. The method of claim 17, further comprising the steps of:

outputting the latch state of the latch; and verifying that the bit cell was programmed by the logic value of the output of the latch.

19. The method of claim 17, further comprising the steps of:

outputting the latch state to an input of a NOR gate; and verifying that the bit cell was erased by the logic value of an output of the NOR gate.

* * * * *